US008139351B2

(12) United States Patent
Lo

(10) Patent No.: US 8,139,351 B2
(45) Date of Patent: Mar. 20, 2012

(54) ROTARY-DISC MEMORY DEVICE

(76) Inventor: Yu-Nan Lo, Taichung County (TW)

( * ) Notice: Subject to any disclaimer, the term of this patent is extended or adjusted under 35 U.S.C. 154(b) by 243 days.

(21) Appl. No.: 12/642,475

(22) Filed: Dec. 18, 2009

(65) Prior Publication Data

US 2011/0149498 A1   Jun. 23, 2011

(51) Int. Cl.
G06F 1/16 (2006.01)
(52) U.S. Cl. ............... 361/679.31; 29/603.03; 235/487; 360/98.01; 369/53.28
(58) Field of Classification Search ............... 29/603.03, 29/283.5, 718, 505, 89.5; 235/449, 400, 235/493, 375, 487; 360/97.01, 264.3, 72.2, 360/133, 98.01, 101, 77.07, 265.6; 174/256, 174/261, 250; 361/679.31, 679.32, 679.33, 361/679.34, 679.35, 679.4, 679.56; 345/473, 345/156, 32, 441, 419, 426; 369/13.37, 100, 369/53.28, 44.32
See application file for complete search history.

(56) References Cited

U.S. PATENT DOCUMENTS

| | | | | |
|---|---|---|---|---|
| 4,814,916 A * | 3/1989 | Nishida et al. | ............. | 360/264.3 |
| 5,583,721 A * | 12/1996 | Kim | ............. | 360/97.01 |
| 6,857,569 B1 * | 2/2005 | Smith et al. | ............. | 235/449 |
| 7,275,302 B2 * | 10/2007 | Ng | ............. | 29/603.03 |

* cited by examiner

Primary Examiner — Hung Duong

(57) ABSTRACT

A rotary-disc memory device comprises a memory device body which is connected to a rotary disc through a connecting shaft. The rotary disc is rotated to drive the connecting shaft to push the memory device body, so that the memory device body can be extended out of or retracted into the memory device.

8 Claims, 6 Drawing Sheets

ROTARY-DISC MEMORY DEVICE

FIELD OF THE INVENTION

The present invention relates to a static data memory device; and more particularly to a rotary-disc memory device.

DESCRIPTION OF THE PRIOR ART

With the improvement of science and technology, the computer products develop rapidly, wherein the computer data storage device has evolved from the early soft disk, hard disk and optical disk into today's flash disk which becomes the most popular data storage device due to its advantages of small volume and large storage capacity. All the flash disks include a USB (universal serial bus) connecting port to be connected to the computer. Conventionally, a flash disk is provided with a cover to cover the USB connecting port, since the flash disk is small, the cover is prone to being lost. Therefore, another retractable type flash disk was developed and is provided on an external surface of the flash disk with an extending/retracting structure which can be linearly pushed to push the USB connecting port into or out of the flash disk.

SUMMARY OF THE INVENTION

The primary objective of the present invention is to provide a rotary-disc memory device whose memory device body can be extended out of or retracted into the memory device by rotating a rotary disc.

In order to achieve the above objective, a rotary-disc memory device in accordance with the present invention comprises a lower cover, a rotary disc, a memory device body, a connecting shaft and an upper cover. The lower cover includes an accommodation space and a bottom, and the lower cover further includes an opening in one end thereof and a curved limiting slot in a bottom thereof. The limiting slot is formed with a limiting track at an edge thereof, and the limiting track includes a concave engaging portion in each of two ends thereof. The rotary disc is provided with a positioning protrusion extending outwards from a circumference thereof, the rotary disc is positioned at an external side of the bottom of the lower cover and covers the limiting slot, and the positioning protrusion of the rotary disc abuts against the limiting track of the lower cover. The memory device body includes a connecting terminal at one end thereof and is disposed in the accommodation space of the lower cover, and the connecting terminal of the memory device body is located in alignment with the opening of the lower cover. The connecting shaft has one end connected to the memory device body, and the other end of the connecting shaft is connected to the rotary disc, so that the rotary disc, the memory device body and the connecting shaft can be drivingly connected together. The upper cover includes an opening in one end thereof, and the upper cover and the lower are closed with respect to each other. The opening of the upper cover is located opposite the opening of the lower cover.

By such arrangements, the rotary disc can be rotated to drive the connecting shaft to push the memory device body into or out of the memory device through the openings of the lower cover and the upper cover.

DETAILED DESCRIPTION OF THE PREFERRED EMBODIMENTS

Figure 1:
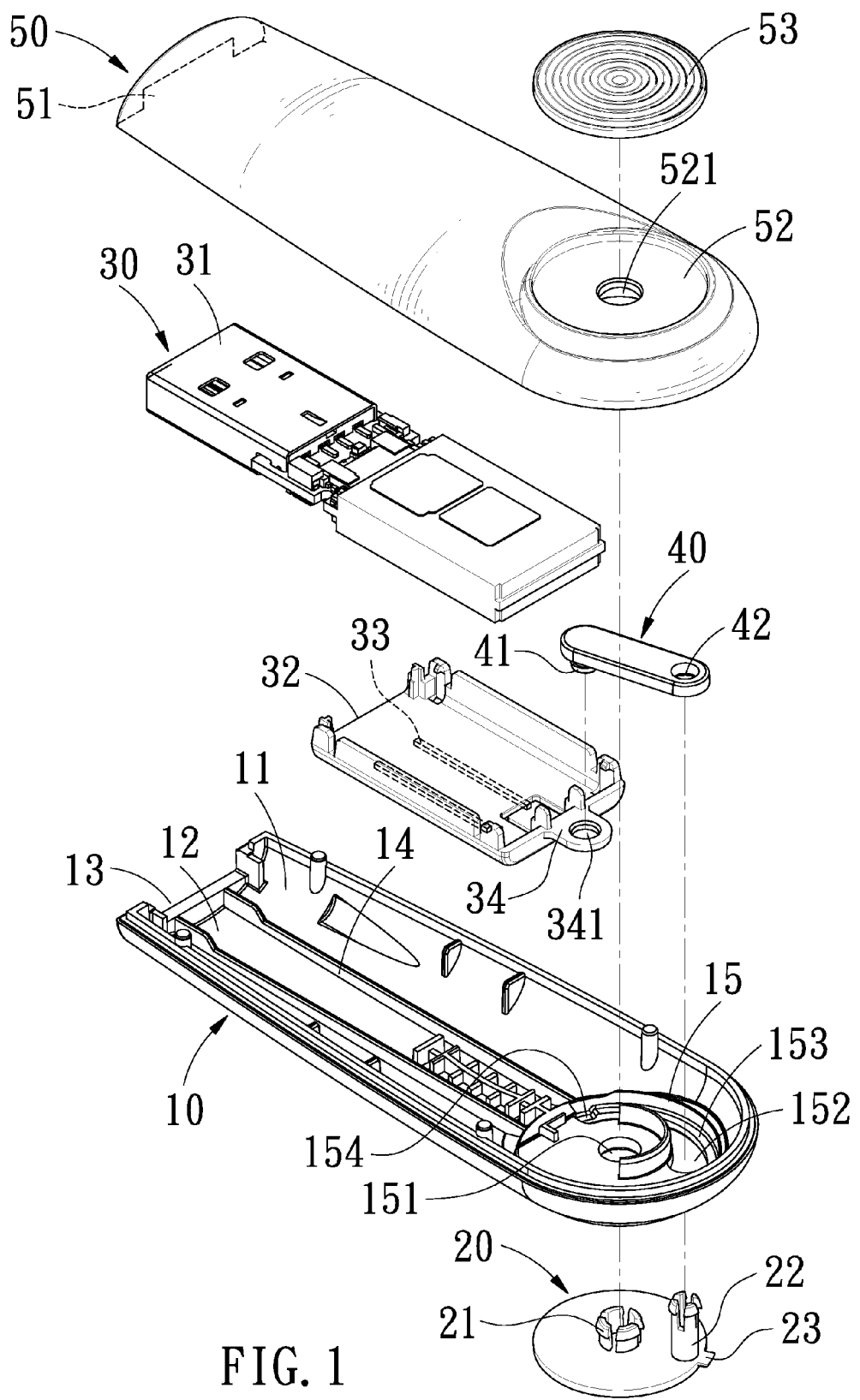
FIG. 1 is an exploded view of a rotary-disc memory device in accordance with the present invention.
Figure 2:
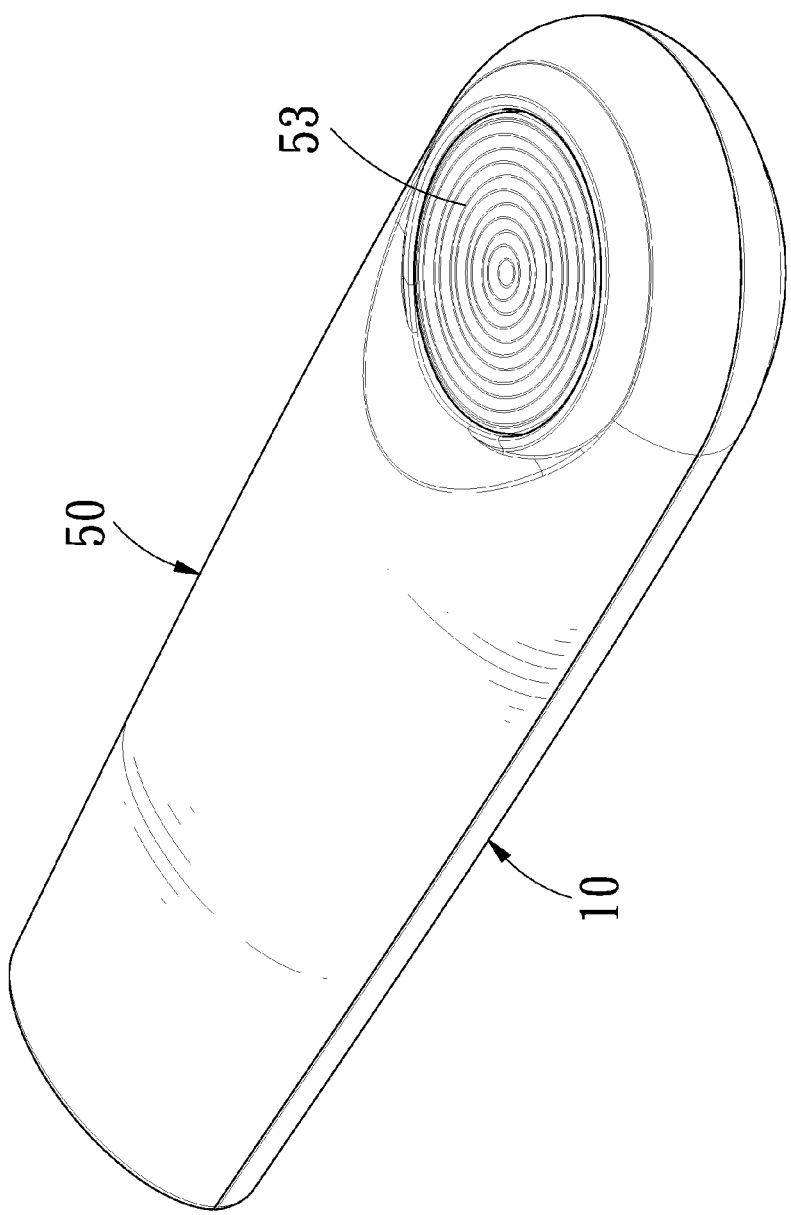
FIG. 2 is a perspective view of the rotary-disc memory device in accordance with the present invention.

The present invention will be clearer from the following description when viewed together with the accompanying drawings, which show, for purpose of illustrations only, the preferred embodiment in accordance with the present invention.

Referring to FIGS. 1-7, a rotary-disc memory device in accordance with a preferred embodiment of the present invention comprises a lower cover 10, a rotary disc 20, a memory device body 30, a connecting shaft 40, and an upper cover 50.

The lower cover 10 includes an accommodation space 11 and a bottom 12. The lower cover 10 further includes an opening 13 in one end thereof and two parallel guiding plates 14 on the bottom 12. The longitudinal direction of the two parallel guiding plates 14 runs toward the opening 13. The lower cover 10 is further provided with a rotary-disc positioning portion 15 on an end of the bottom 12 opposite the opening 13. The rotary-disc positioning portion 15 is centrally defined with a rotary-disc positioning hole 151. The rotary-disc positioning portion 15 is further defined with a curved limiting slot 152 concentric with the positioning hole 151. The limiting slot 152 is formed with a limiting track 153 at one side of an edge thereof away from the rotary-disc positioning hole 151. The limiting track 153 includes a concave engaging portion 154 in each of two ends thereof.

The rotary disc 20 is round and provided on one side thereof with a central positioning cylinder 21 and a driving cylinder 22 adjacent to a circumference thereof. The rotary disc 20 is further provided with a positioning protrusion 23 which is located adjacent to the driving cylinder 22 and extends outwards from the circumference of the rotary disc 20. The rotary disc 20 is positioned at an external side of the bottom 12 of the lower cover 10 by inserting the positioning cylinder 21 into the rotary-disc positioning hole 151 of the lower cover 10 from the external side of the lower cover 10. The driving cylinder 22 is inserted into the lower cover 10 through the limiting slot 152, and the rotary disc 20 covers the limiting slot 152. Further, the positioning protrusion 23 of the rotary disc 20 abuts against the limiting track 153, and the driving cylinder 22 is allowed to slide and rotate along the limiting slot 152.

The memory device body 30 includes a connecting terminal 31 at one end thereof and is assembled with a base 32. The base 32 encloses the other end of the memory device body 30 and is formed with two parallel guiding rails 33 on an external bottom surface thereof. The base 32 is further provided with a connecting plate 34 at one end thereof opposite the connecting terminal 31. The connecting plate 34 includes a connecting hole 341. The memory device body 30 is disposed in the accommodation space 11 of the lower cover 10, the two guiding rails 33 of the base 32 are located between the two guiding plates 14 of the lower cover 10 while abutting against the respective guiding plates 14, and the connecting terminal 31 of the memory device body 30 is located in alignment with the opening 13 of the lower cover 10.

The connecting shaft 40 includes a base connecting pin 41 and a rotary-disc connecting hole 42 at both ends thereof. The base connecting pin 41 at one end of the connecting shaft 40 is inserted into the connecting hole 341 of the connecting plate 34 of the base 32, and the rotary-disc connecting hole 42 in the other end of the connecting shaft 40 is engaged with the driving cylinder 22 of the rotary disc 20 in the limiting slot 152, so that the rotary disc 20, the memory device body 30 and the connecting shaft 40 are drivingly connected together.

The upper cover 50 includes an opening 51 in one end thereof and an ornament groove 52 in an external surface thereof. The ornament groove 52 is centrally defined with a positioning hole 521. The upper cover 50 is further assembled with an ornament 53 which is shaped correspondingly to the ornament groove 52. The ornament 53 includes a positioning cylinder 531 on a bottom surface thereof. The ornament 53 is disposed in the ornament groove 52, and the positioning cylinder 531 of the ornament 53 is inserted into the positioning hole 521 of the ornament groove 52. The upper cover 50 and the lower cover 10 are closed with respect to each other, and the opening 51 of the upper cover 50 is located opposite the opening 13 of the lower cover 10.

Figure 3:
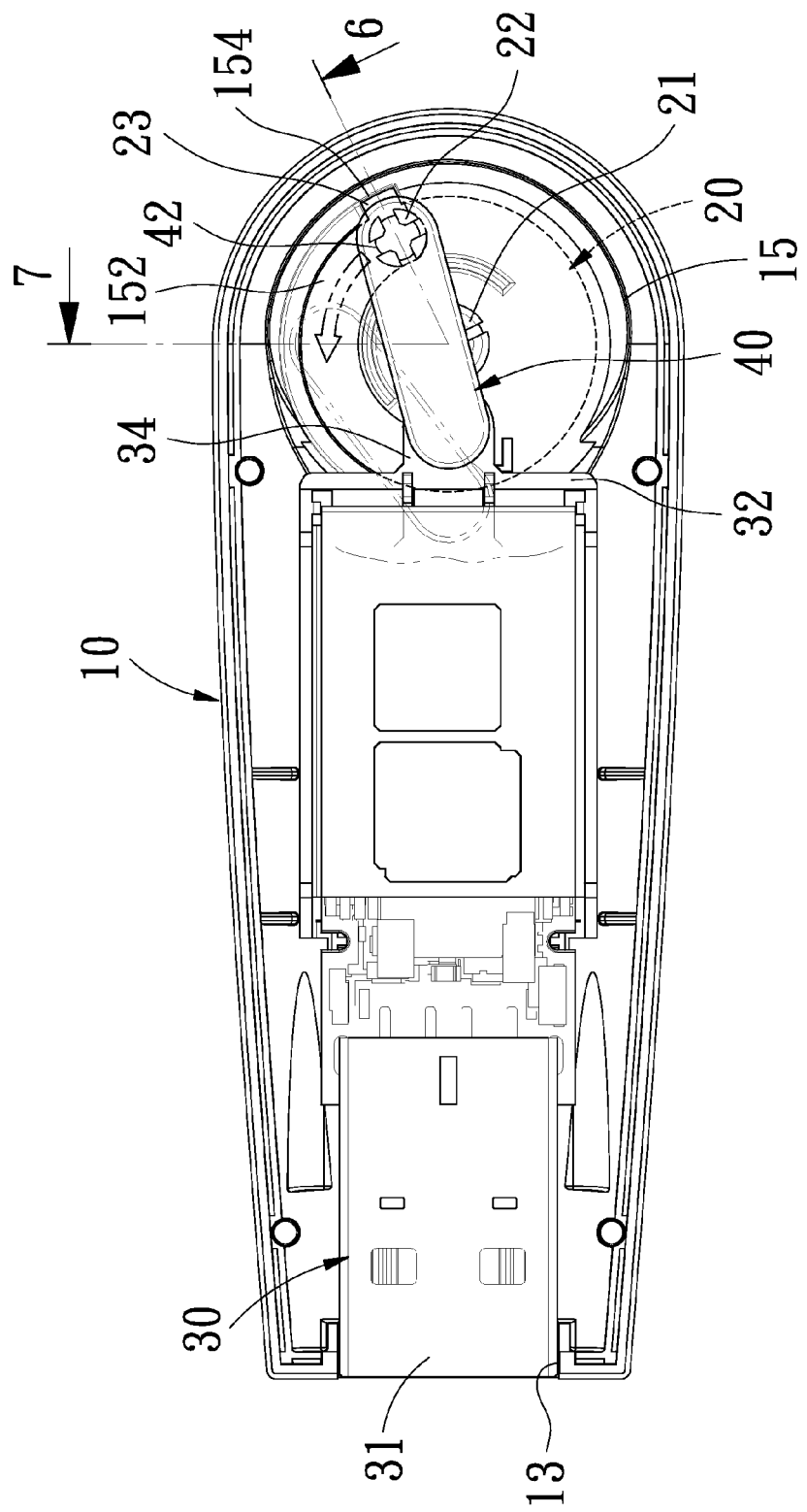
FIG. 3 is a top view showing the inner configuration of the rotary-disc memory device in accordance with the present invention whose upper cover is removed.
Figure 4:
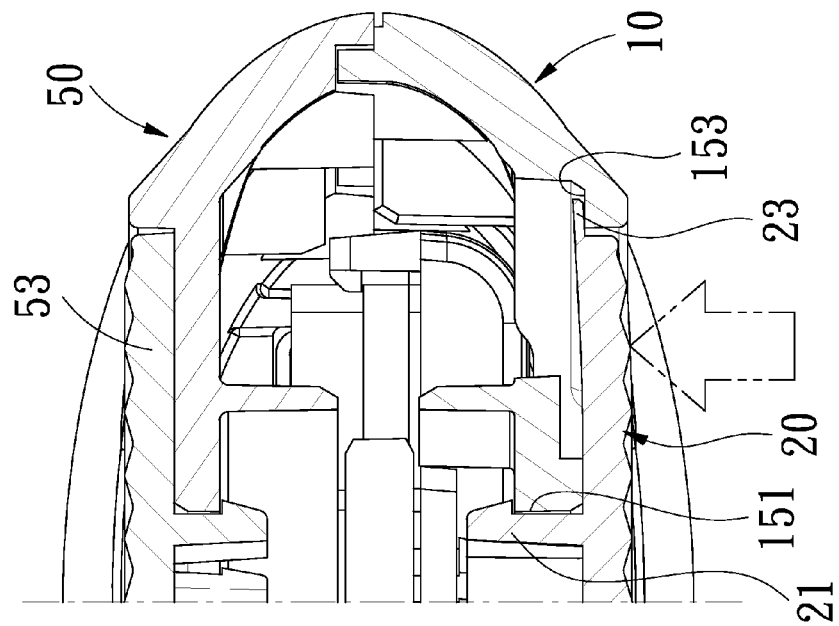
FIG. 4 is a partial enlarged cross-sectional view showing that the positioning protrusion of the rotary disc of the rotary-disc memory device in accordance with the present invention is disposed in the engaging portion of the lower cover.

The aforementioned is the summary of the positional and structural relationship of the respective components of the preferred embodiment in accordance with the present invention. When the memory device of the present invention is to be used, as shown in FIGS. 3-4 in which the upper cover 50 is removed for facilitating description, since the rotary disc 20 is connected to the connecting shaft 40 which is connected to the memory device body 30, when the memory device body 30 is pushed into the upper cover 50 and the lower cover 10, as shown in FIG. 3, the positioning protrusion 23 of the rotary disc 20 will be received in one of the concave engaging portions 154 of the rotary-disc positioning portion 15 of the lower cover 10, which is located away from the opening 13, so as to position the rotary disc 20.

Figure 5:
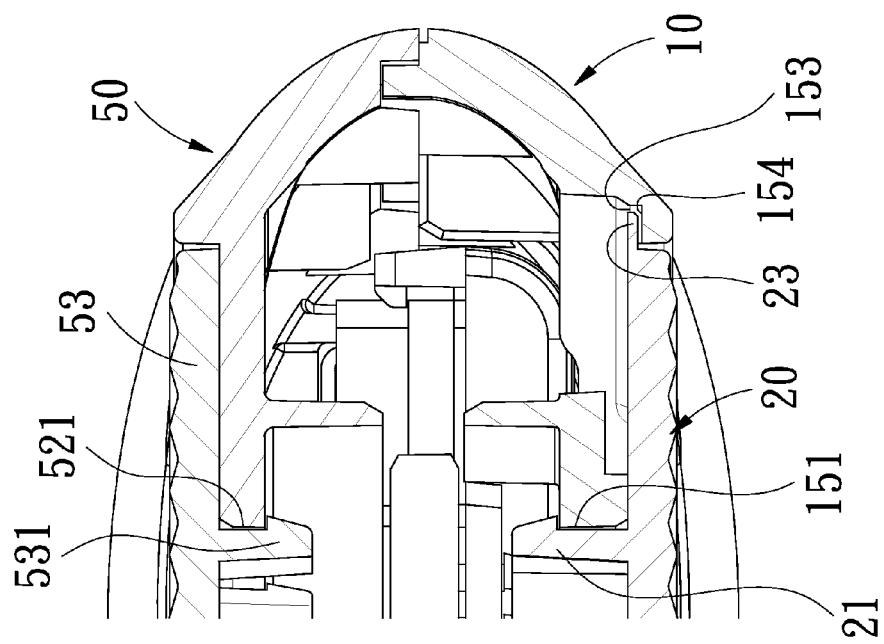
FIG. 5 is a partial enlarged cross-sectional view showing that the rotary disc of the rotary-disc memory device in accordance with the present invention is pressed to make the circumference of the rotary disc deform slightly to engage the positioning protrusion into the limiting track.
Figure 6:
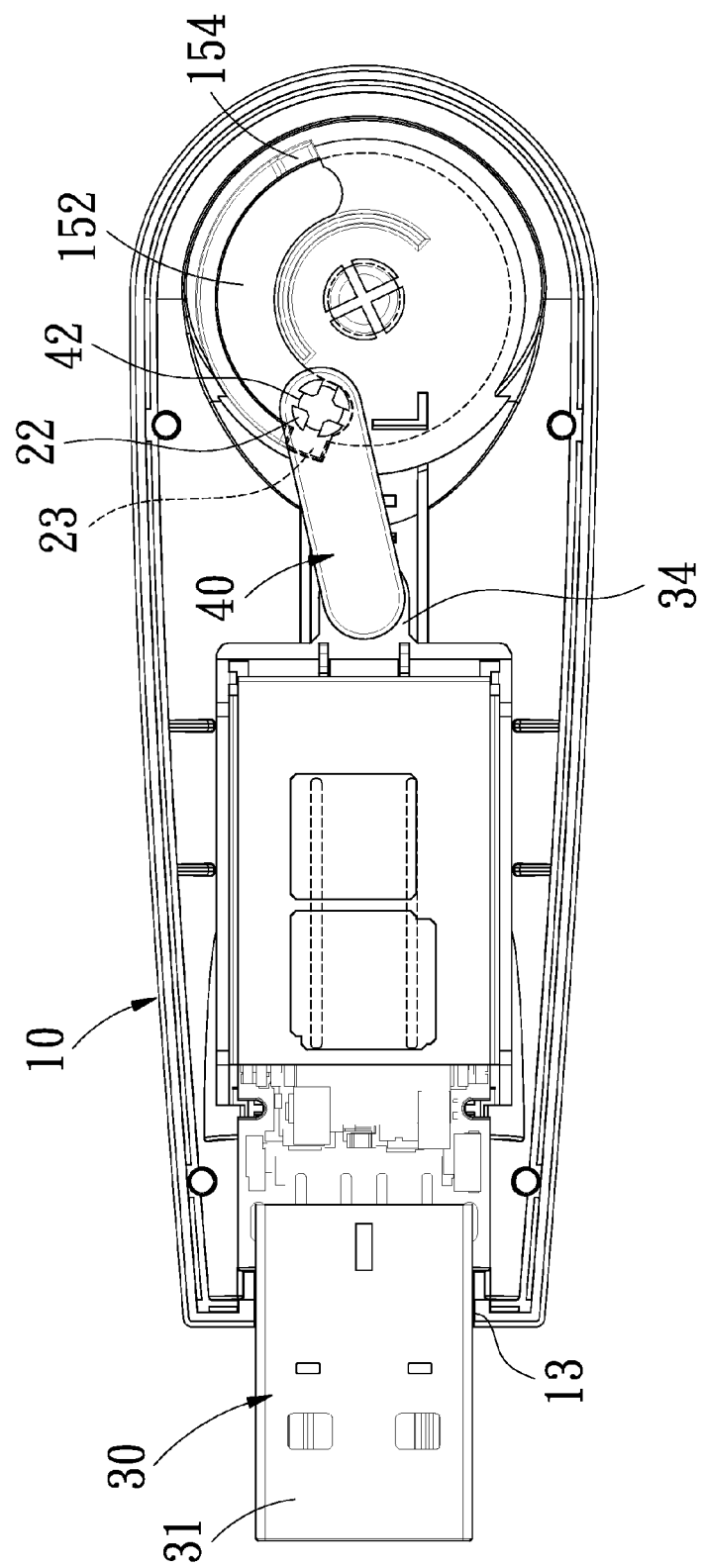
FIG. 6 is schematic view showing the inner configuration of the rotary-disc memory device in accordance with the present invention when the upper cover is removed and the memory device body is pushed out.
Figure 7:
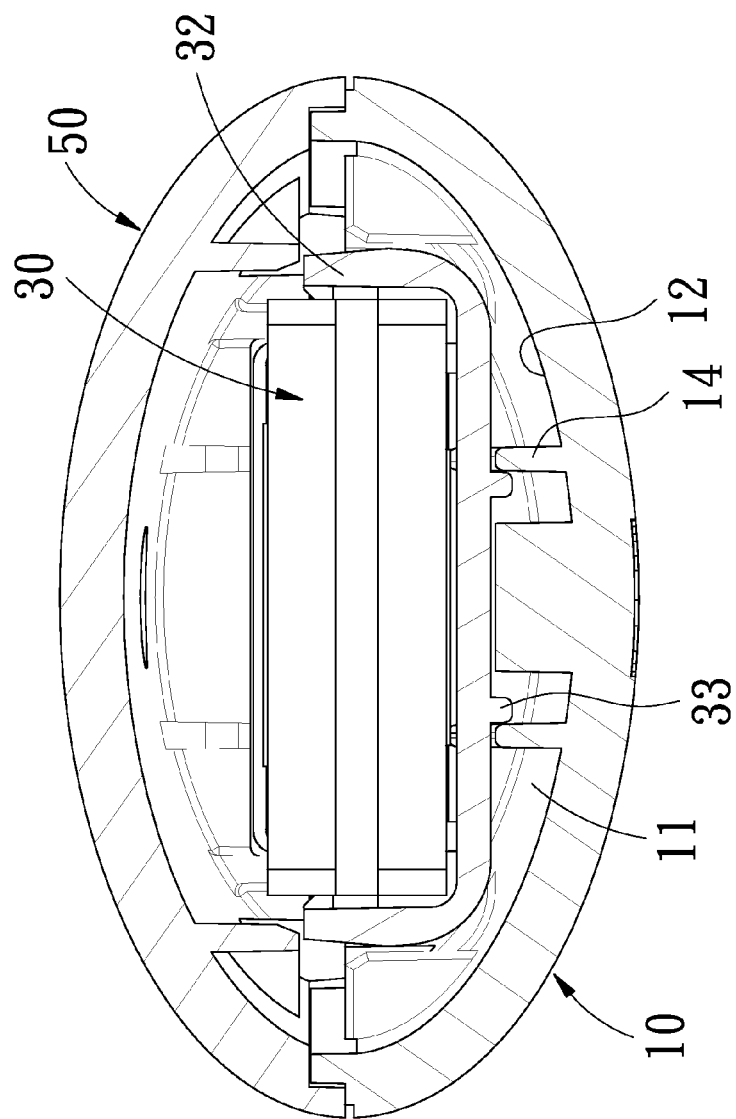
FIG. 7 is a cross-sectional view of the rotary-disc memory device in accordance with the present invention.

When the memory device body 30 is to be pushed out for use, referring to FIGS. 5-7, the user presses the circumference of the rotary disc 20 to make it deform slightly while making the positioning protrusion 23 at the circumference of the rotary disc 20 deform toward the limiting track 153 of the lower cover 10, and then the user presses the rotary disc 20 continuously to make the positioning protrusion 23 of the rotary disc 20 engage into the limiting track 153, at this moment, the user keeps pressing the rotary disc 20 while rotating the rotary disc 20 along the limiting slot 152 of the lower cover 10, so that the driving cylinder 22 of the rotary disc 20 can drive the connecting shaft 40 to push the memory device body 30 out of the opening 13 for use.

During the movement of the memory device body 30, referring to FIG. 7, the guiding rails of the base 32 of the memory device body 30 are guided by the guiding plates 14 of the lower cover 10 to linearly extend out of the opening 13 of the lower cover 10, thus avoiding the deviation of the memory device body 30.

While we have shown and described various embodiments in accordance with the present invention, it is clear to those skilled in the art that further embodiments may be made without departing from the scope of the present invention.

What is claimed is:

1. A rotary-disc memory device comprising:
   a lower cover including an accommodation space and a bottom, the lower cover further including an opening in one end thereof and a curved limiting slot in a bottom thereof, the limiting slot being formed with a limiting track at an edge thereof, the limiting track including a concave engaging portion in each of two ends thereof;
   a rotary disc being provided with a positioning protrusion extending outwards from a circumference thereof, the rotary disc being positioned at an external side of the bottom of the lower cover and covering the limiting slot, the positioning protrusion of the rotary disc abutting against the limiting track of the lower cover;
   a memory device body including a connecting terminal at one end thereof and being disposed in the accommodation space of the lower cover, the connecting terminal of the memory device body being located in alignment with the opening of the lower cover;
   a connecting shaft having one end connected to the memory device body, and the other end of the connecting shaft being connected to the rotary disc, so that the rotary disc, the memory device body and the connecting shaft are drivingly connected together; and
   an upper cover including an opening in one end thereof, the upper cover and the lower being closed with respect to each other, and the opening of the upper cover being located opposite the opening of the lower cover.

2. The rotary-disc memory device as claimed in claim 1, wherein the limiting slot of the lower cover is defined in a rotary-disc positioning portion, the rotary-disc positioning portion is disposed on an end of the bottom of the lower cover opposite the opening of the lower cover, the rotary-disc positioning portion is centrally defined with a rotary-disc positioning hole, the limiting slot is concentric with the rotary-disc positioning hole.

3. The rotary-disc memory device as claimed in claim 2, wherein the limiting track is formed at one side of the edge of the limiting slot away from the rotary-disc positioning hole.

4. The rotary-disc memory device as claimed in claim 2, wherein the rotary disc is round and provided with a central positioning cylinder, the rotary disc is positioned by inserting the positioning cylinder into the rotary-disc positioning hole from the external side of the bottom of the lower cover.

5. The rotary-disc memory device as claimed in claim 4, wherein the rotary disc is further provided on the same side as the positioning cylinder with a driving cylinder adjacent to a circumference thereof, the positioning protrusion is disposed adjacent to the driving cylinder, the driving cylinder of the rotary disc is inserted into the lower cover through the limiting slot of the lower cover, the end of the connecting shaft, which is connected to the rotary disc, is defined with a rotary-disc connecting hole, the rotary-disc connecting hole is engaged with the driving cylinder of the rotary disc in the limiting slot.

6. The rotary-disc memory device as claimed in claim 1, wherein the lower cover further includes two parallel guiding plates on the bottom thereof, a longitudinal direction of the two parallel guiding plates runs towards the opening of the lower cover, the memory device body is further assembled with a base, the base encloses the other end of the memory device body, the base is formed with two parallel guiding rails on an external bottom surface thereof, the two guiding rails of the base are located between the two guiding plates of the lower cover while abutting against the respective guiding plates.

7. The rotary-disc memory device as claimed in claim 6, wherein the base of the memory device body is further provided with a connecting plate at one end thereof opposite the connecting terminal, the connecting plate includes a connecting hole, the end of the connecting shaft, which is connected to the memory device body, is formed with a base connecting pin, the base connecting pin is inserted into the connecting hole of the connecting plate of the base of the memory device body.

8. The rotary-disc memory device as claimed in claim 1, wherein the upper cover is defined with an ornament groove in an external surface thereof, the ornament groove is centrally defined with a positioning hole, the upper cover is further assembled with an ornament which is shaped correspondingly to the ornament groove, the ornament includes a positioning cylinder on a bottom surface thereof, the ornament is received in the ornament groove, and the positioning cylinder of the ornament is inserted into the positioning hole of the ornament groove.

\* \* \* \* \*